United States Patent
Ota et al.

(10) Patent No.: US 6,795,167 B2
(45) Date of Patent: Sep. 21, 2004

(54) PROJECTION EXPOSURE APPARATUS AND DEVICE MANUFACTURING METHOD USING THE SAME

(75) Inventors: Masakatsu Ota, Tokyo (JP); Naoto Sano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,303

(22) Filed: Nov. 8, 2001

(65) Prior Publication Data

US 2002/0089654 A1 Jul. 11, 2002

(30) Foreign Application Priority Data

Nov. 10, 2000 (JP) ........................................ 2000/344474

(51) Int. Cl.⁷ .................. G03B 27/54; G03B 27/68; G03B 27/42; G03B 27/52
(52) U.S. Cl. ........................ 355/67; 355/52; 355/53; 355/55
(58) Field of Search ......................... 355/52, 53, 55, 355/67, 69, 63

(56) References Cited

U.S. PATENT DOCUMENTS

| | | | |
|---|---|---|---|
| 4,773,750 A | 9/1988 | Bruning | 353/122 |
| 4,811,055 A | 3/1989 | Hirose | 355/53 |
| 4,891,663 A | 1/1990 | Hirose | 355/53 |
| 4,922,290 A * | 5/1990 | Yoshitake et al. | 355/53 |
| 5,095,190 A * | 3/1992 | Aketagawa et al. | 219/121.74 |
| 5,170,207 A * | 12/1992 | Tezuka et al. | 355/53 |
| 5,838,426 A * | 11/1998 | Shinonaga et al. | 355/52 |
| 5,920,398 A * | 7/1999 | Iwanaga et al. | 250/559.3 |
| 6,442,181 B1 * | 8/2002 | Oliver et al. | 372/25 |

FOREIGN PATENT DOCUMENTS

| | | | |
|---|---|---|---|
| EP | 0 820 132 | 1/1998 | |
| EP | 0 820 132 A2 * | 1/1998 | ........... H01S/3/225 |
| EP | 0 997 225 | 5/2000 | |
| EP | 1 026 796 | 8/2000 | |
| EP | 1 032 097 | 8/2000 | |
| EP | 1 032 098 | 8/2000 | |
| EP | 1 039 595 | 9/2000 | |
| JP | 9-199403 | 7/1997 | |
| JP | 10-163547 | 6/1998 | |

* cited by examiner

Primary Examiner—Alan Mathews
(74) Attorney, Agent, or Firm—Fitzpatrick, Cella, Harper & Scinto (57) ABSTRACT

A projection exposure apparatus includes an illumination optical system for illuminating a pattern of a reticle with laser light from a continuous emission excimer laser, a projection optical system projecting the illuminated pattern onto a substrate, an adjusting device for adjusting an optical characteristic of the projection optical system in accordance with a change in wavelength of the laser, and a wavelength stabilizing device for stabilizing the wavelength of the laser light when the adjustment of the optical characteristic of the projection optical system by the adjusting device is insufficient.

6 Claims, 11 Drawing Sheets

PROJECTION EXPOSURE APPARATUS AND DEVICE MANUFACTURING METHOD USING THE SAME

FIELD OF THE INVENTION AND RELATED ART

This invention relates to a projection exposure apparatus and a device manufacturing method using the same. More particularly, the invention concerns a projection exposure apparatus and a device manufacturing method which are suitably usable in a projection exposure step in a photolithographic process, specifically, for the manufacture of semiconductor devices such as ICs or LSIs, image pickup devices such as CCDs, display devices such as liquid crystal panels, and magnetic head devices, for example. In the present invention, a continuous emission excimer laser may be used as a light source for transferring a pattern of a reticle onto a photosensitive substrate.

A continuous emission excimer laser can be used as a light source in the manufacture of semiconductor devices or other devices such as liquid crystal panels, for example, based on the photolithographic technology (Japanese Laid-Open Patent Application, Laid-Open No. 1635471998).

The aforementioned Japanese patent application document discloses the use of an incoherency transforming system in which speckle patterns are removed by use of a rotary diffusion plate provided in an illumination optical system for illuminating a reticle. However, this document does not specifically refer to how to construct a projection optical system for projecting the circuit pattern of the reticle.

Continuous emission excimer lasers have a very narrow half bandwidth of a wavelength spectrum, being narrower than that of pulse emission excimer lasers. In consideration of it, despite that a required resolution is smaller than 0.2 micron, the projection optical system may be provided by a monochromatic lens system (without chromatic aberration correction), all being made of a single glass material. However, continuous emission excimer lasers have a characteristic that the emission wavelength thereof is variable. Therefore, if a monochromatic lens system is used, there would occur a variation in the optical characteristic of the lens system, such as magnification, focal point position and aberration, for example, due to changes in the wavelength spectrum of the laser light. This leads to a problem that a circuit pattern of a reticle cannot be projected on a wafer exactly.

SUMMARY OF THE INVENTION

It is accordingly an object of the present invention to provide a projection exposure apparatus and a device manufacturing method, by which a pattern of a reticle can be projected on a substrate very accurately even when a continuous emission excimer laser is used as a light source and even when a monochromatic lens is used as a projection optical system.

In accordance with an aspect of the present invention, there is provided a projection exposure apparatus, comprising an illumination optical system for illuminating a pattern of a reticle with laser light from a continuous emission excimer laser, and a projection optical system for projecting the illuminated pattern onto a substrate. The projection optical system is provided by a lens system being made of a substantially single glass material. Also, the apparatus is provided with adjusting means for adjusting an optical characteristic of the projection optical system in accordance with a change in wavelength of the laser light.

In accordance with another aspect of the present invention, there is provided a device manufacturing method, comprising the steps of: exposing a substrate with a pattern by use of a projection exposure apparatus as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
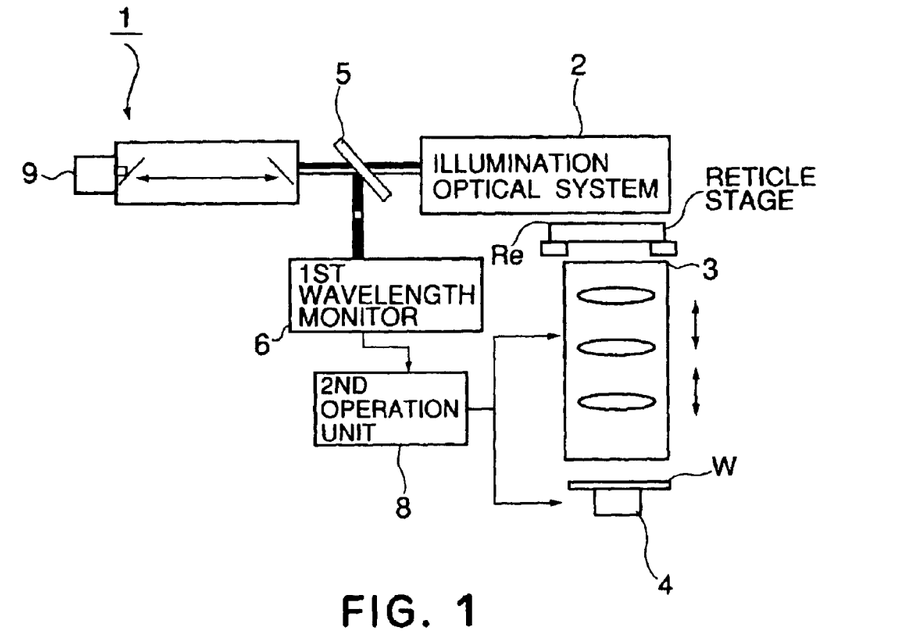
FIG. 1 is a schematic view of a main portion of a projection exposure apparatus according to a first embodiment of the present invention.

FIG. 1 is a schematic view of a projection exposure apparatus according to a first embodiment of the present invention. In this embodiment, the invention is applied to a step-and-scan type scanning projection exposure apparatus having a resolution of 0.13 micron or less, being usable for the production of various devices such as semiconductor devices, liquid crystal devices, image pickup devices and magnetic heads, for example.

Denoted in FIG. 1 at 1 is an ArF excimer laser of a continuous emission type, having a center wavelength of a wavelength spectrum of 193 nm and a half bandwidth of 0.2 pm or less, preferably, not greater than 0.1 pm. Denoted at 5 is a half mirror (semi-transmission mirror), and denoted at 2 is an illumination optical system for illuminating a reticle Re having a circuit pattern formed thereon, with the use of laser light from the laser 1. Denoted at 3 is a projection optical system for projecting a reduced image of the circuit pattern of the reticle Re, onto a wafer W. The projection optical system 3 is provided by a lens system being made of a substantially single glass material. Denoted at 4 is a movable stage being movable while holding a wafer W thereon.

In the projection exposure apparatus of FIG. 1, in relation to each shot area on the wafer W, the reticle Re is illuminated with slit-like illumination light of a rectangular or arcuate sectional shape. Also, in regard to the widthwise direction of the slit-like section of this illumination light, the reticle Re and the wafer W are scanningly moved in mutually opposite directions, along a direction orthogonal to the optical axis of the projection optical system 3, and at a speed ratio the same as the projection magnification of the projection optical system 3. With this procedure, the circuit pattern of the reticle Re is projected and printed on each shot area on the wafer W.

Denoted in FIG. 1 at 5 is a semi-transmission mirror, and denoted at 6 is a wavemeter (first wavelength monitor) for receiving a portion of the laser light, reflected by the semi-transmission mirror 5, to detect the wavelength of laser light.

Denoted at 8 is a second operation unit, which is operable in response to an output of the wavemeter 6, to detect any deviation of the current center wavelength (as represented by that output) from the design wavelength. Also, this operation unit is operable to adjust changes in the optical characteristic of the projection optical system 3 resulting from that deviation. As regards the adjustment, it may be done by moving plural lenses of the projection optical system or the movable stage in the optical axis direction, by changing the pressure of a closed space between adjacent lenses, or by injecting a gas having a refractive index different from that of the air, into a closed space between adjacent lenses, for example.

With this procedure, in the projection optical system 3, which is a monochromatic lens system, any variation in optical characteristics such as magnification, focal point position and aberration, for example, due to changes in wavelength of the laser light can be avoided. Therefore, a circuit pattern of a reticle Re can be projected onto a wafer W very accurately.

Here, the second operation unit 8 may be arranged to evaluate the outputs of various sensors (not shown) and to correct any change in optical characteristic of the projection optical system such as magnification, focal point position and aberration, for example, being variable with temperature, humidity, pressure, or thermal absorption of an optical component, for example. The optical characteristic correction may be carried out, for example, by moving lens elements or moving the movable stage 4 in the optical axis direction, by decentering an optical member, or by changing an air pressure between adjacent lens elements. In this embodiment, any other optical characteristic correcting means known in the art may be used.

Figure 2:
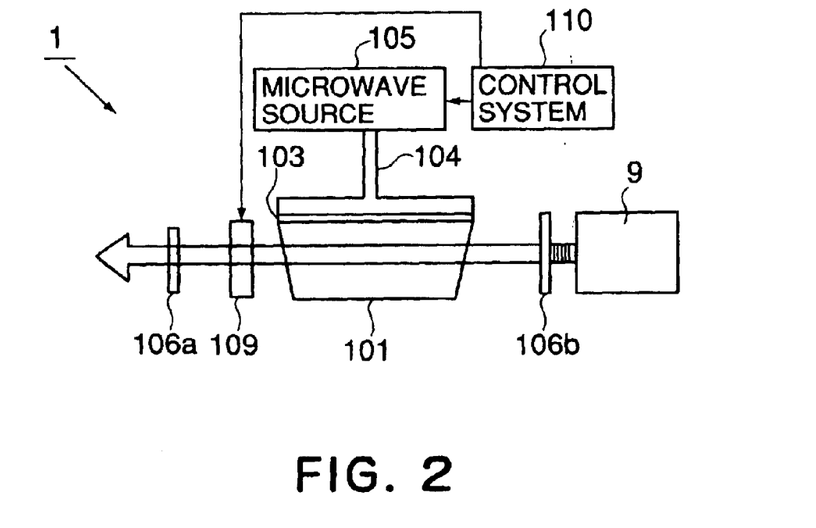
FIG. 2 is a schematic view of a continuous emission excimer laser shown in FIG. 1.

FIG. 2 is a schematic view of the continuous emission excimer laser 1 shown in FIG. 1. Denoted at 101 is a laser chamber in which a gas for excitation is sealingly held, and the gas is circulated therein at a high speed. Denoted at 103 is a dielectric member for introducing microwaves into the laser chamber. Denoted at 104 is a microwave guide tube for guiding the microwaves, and denoted at 105 is a microwave emission source for supplying microwaves.

Denoted at 106a is a half mirror, which is an output mirror, and denoted at 106b is another mirror. Denoted 109 is a shutter, and denoted 110 is a control system for controlling the microwave emission source 105 and the shutter 109. The half mirror 106a and the mirror 106b constitute an optical resonator for the excimer laser 1.

In operation, microwaves generated by the microwave emission source 105 are guided by the microwave guide 104 and, through the dielectric member 103, they continuously excite the excimer laser gas inside the laser chamber 101. Light produced from the thus excited excimer laser gas is reflected by the mirrors 106a and 106b back to the laser chamber 1, and it causes inductive excitation light emission with the excited excimer laser gas. Light produced thereby advances reciprocally inside the optical resonator (laser resonator), comprising the half mirror 106a and the mirror 106b, and it causes successive stimulated emissions. As a result of this, only light of a predetermined wavelength is amplified. Then, a portion of the thus amplified light is outputted through the half mirror 106a.

Figure 3:
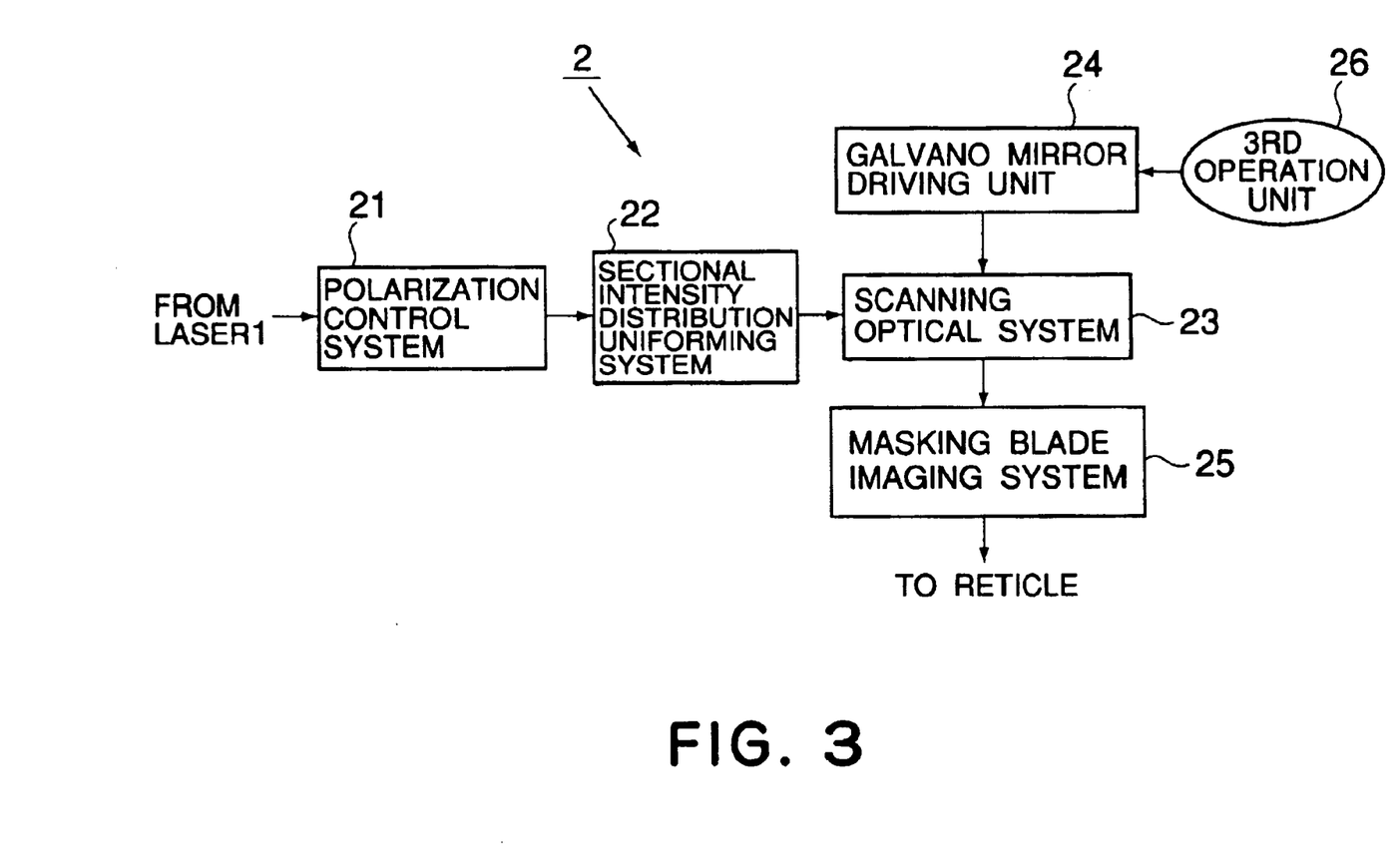
FIG. 3 is a block diagram of a main portion of an illumination system shown in FIG. 1.

FIG. 3 is a block diagram for explaining the structure of the illumination optical system 2 shown in FIG. 1. The illumination optical system 2 shown in FIG. 3 has plural illumination modes. Specifically, it is arranged so that an appropriate illumination mode (shape or size of an effective light source, for example) can be chosen in accordance with the type of the reticle pattern (size, shape or structure, for example).

In FIG. 3, a laser light beam from the excimer laser 1 (FIG. 1) is divided by a polarization control system 21 into at least two light beams. If it is bisected, for example, the laser beam may be divided into two light beams having mutually orthogonal polarization directions. Laser light, which consists of these two light beams, being combined, is received by a sectional intensity distribution uniforming system 22 by which the sectional intensity distribution of the laser light is made uniform. The sectional intensity distribution uniforming system may include at least one of a combination of a fly's eye lens and a lens, and an optical pipe (kaleidoscope). Also, the polarization control system 21 may include a polarization beam splitter for dividing light, for example.

Laser light from the sectional intensity distribution uniforming system 22 is focused by a scanning optical system 23 upon a pupil plate of the illumination optical system 2, and a light spot is produced there. Then, one or two galvano mirrors of the scanning optical system 23, provided for two-dimensional scanning, are actuated and rotated by a driving unit 24, by which the laser light spot is scanningly moved. As a result of this, a secondary light source (effective light source) having a predetermined shape and size is produced on the pupil plane. The thus produced secondary light source may have a circular shape, a ring-like zone shape having a finite width, or a quadrupole shape, for example. The shape may be chosen automatically or manually in accordance with the type or size of the pattern of the reticle Re. The laser light from the scanning optical system 23 goes through a masking blade imaging system 25, and it impinges on the reticle (not shown). Consequently, the reticle is illuminated with slit-like light having a rectangular or arcuate sectional shape as described above.

The masking blade imaging system 25 serves to form, upon the reticle, an image of a masking blade, which is disposed before or after the above-described pupil plane to determine the shape of the rectangular or arcuate slit and held optically conjugate with the reticle.

Also, the light reflecting position of one or two galvano mirrors provided for the two-dimensional scan and the position of the circuit pattern of the reticle are placed in an optically conjugate relation. Based on these relationships, light beams from plural secondary light sources, which are produced successively with rotation of the galvano mirror or mirrors, can be superposedly projected on the same region on the reticle.

The pupil plane of the illumination optical system 2 is disposed in an optically conjugate relation with the pupil plane (aperture stop) of the projection optical system 3. As a result, the light intensity distribution at the pupil plane of the illumination optical system 2 is substantially directly projected on the pupil plane of the projection optical system 3.

Figure 4A:
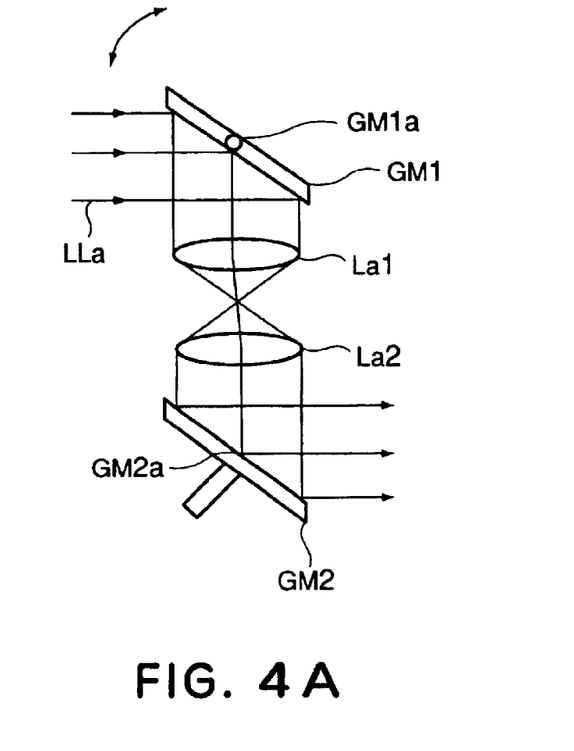
FIGS. 4A and 4B are schematic views, respectively, for explaining a scanning system in an illumination optical system according to the present invention.

FIG. 4A illustrates galvano mirrors GM1 and GM2 in an example in which the scanning optical system 23 has two galvano mirrors.

In FIG. 4A, the galvano mirror GM1 can oscillate in a direction along the sheet of the drawing, as depicted by an arrow, while the galvano mirror GM2 can oscillate in a direction perpendicular to the sheet of the drawing. By these rotational motions, a parallel light beam LLa being parallel to the optical axis is reflectively deflected, and the deflection light is outputted as a parallel light beam, which then goes through a condensing lens system (not shown). With this arrangement, the pupil plane of the illumination optical system is scanned two-dimensionally by a light spot, such that a secondary light source (effective light source) of a desired shape is produced there.

The galvano mirrors GM1 and GM2 have central reflection points GM1a and GM2a, respectively, which are placed approximately in a conjugate relation with each other, with respect to lens systems La1 and La2.

Figure 4B:
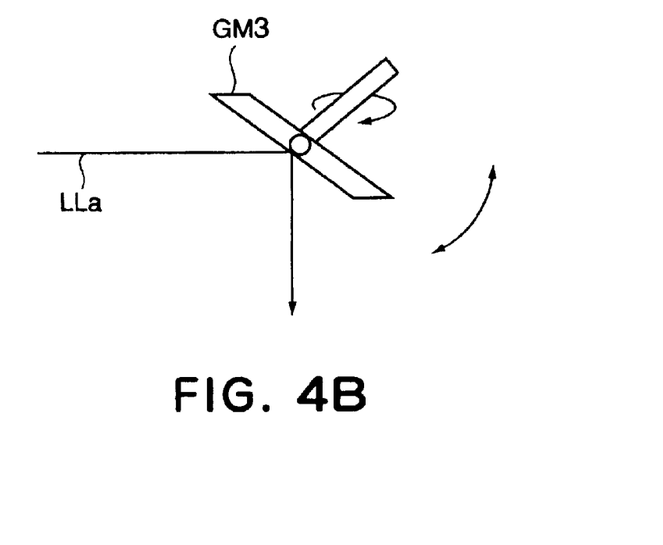

FIG. 4B illustrates a galvano mirror GM3, in an example wherein the scanning optical system includes a single galvano mirror. In FIG. 4B, the galvano mirror GM3 can oscillate in a direction along the sheet of the drawing and also in a direction perpendicular to the sheet of the drawing, to reflectively deflect a light beam LLa incident thereon. Thus, through a condensing lens system (not shown), the pupil plane of the illumination optical system is scanned two-dimensionally, such that a secondary light source (effective light source) is produced there.

FIGS. 5A–5D are schematic views each illustrating a secondary light source produced on the pupil plane of the illumination optical system by means of the scanning optical system 23.

Figure 5A:
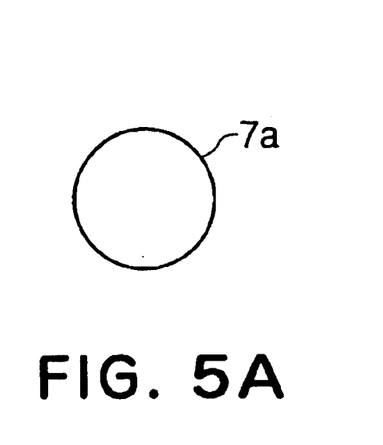
FIGS. 5A, 5B, 5C and 5D are schematic views, respectively, for explaining a secondary light source image upon a pupil plane of an illumination optical system, according to the present invention.
Figure 5B:
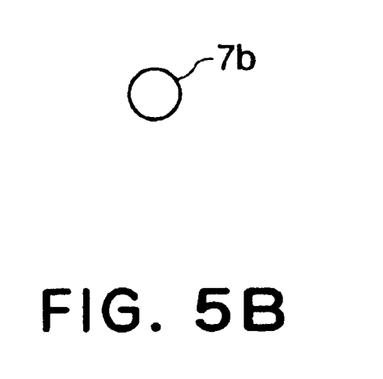
Figure 5C:
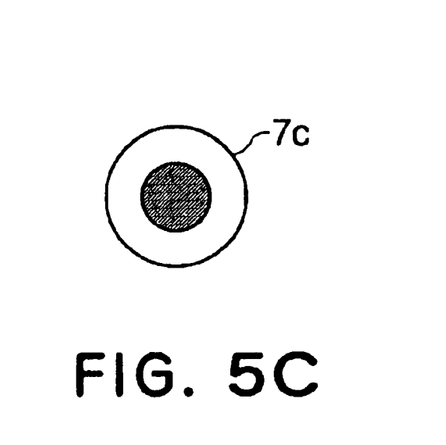
Figure 5D:
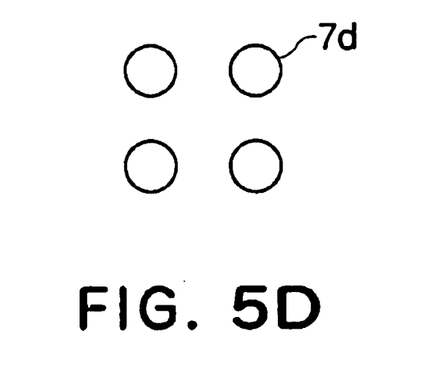

Among these drawings, FIG. 5A shows a circular secondary light source to be used for standard illumination, and it has a sigma value a (the ratio of "NA of the illumination optical system" and "NA of the projection optical system"), which is about 0.5 to 0.7. FIG. 5B shows a circular secondary light source having a a value of about 0.3–0.4, and it can be used for small-94 illumination in a case where a phase shift mask, for example, is used. FIG. 5C shows a secondary light source of a ring-like zone shape, to be used for ring zone illumination. FIG. 5D shows a secondary light source of a quadrupole shape, for quadrupole illumination.

Here, if the scan speed of the reticle Re or wafer W is V (mm/sec), the width of the illumination light (slit) on the reticle is W (mm), and the time necessary for drawing (producing) a secondary light source on the pupil plane once is T (sec), the third operation unit 26 shown in FIG. 3 controls the galvano mirror driving unit 24 so as to satisfy the following relation, to scanningly move the laser light spot:

$$W/V = nT \text{ (where n is an integer)} \quad (a)$$

As a result of this, the whole shot region on the wafer can be exposed on the basis of the effective light source of the same shape, such that uniform exposure is assured.

Figure 6:
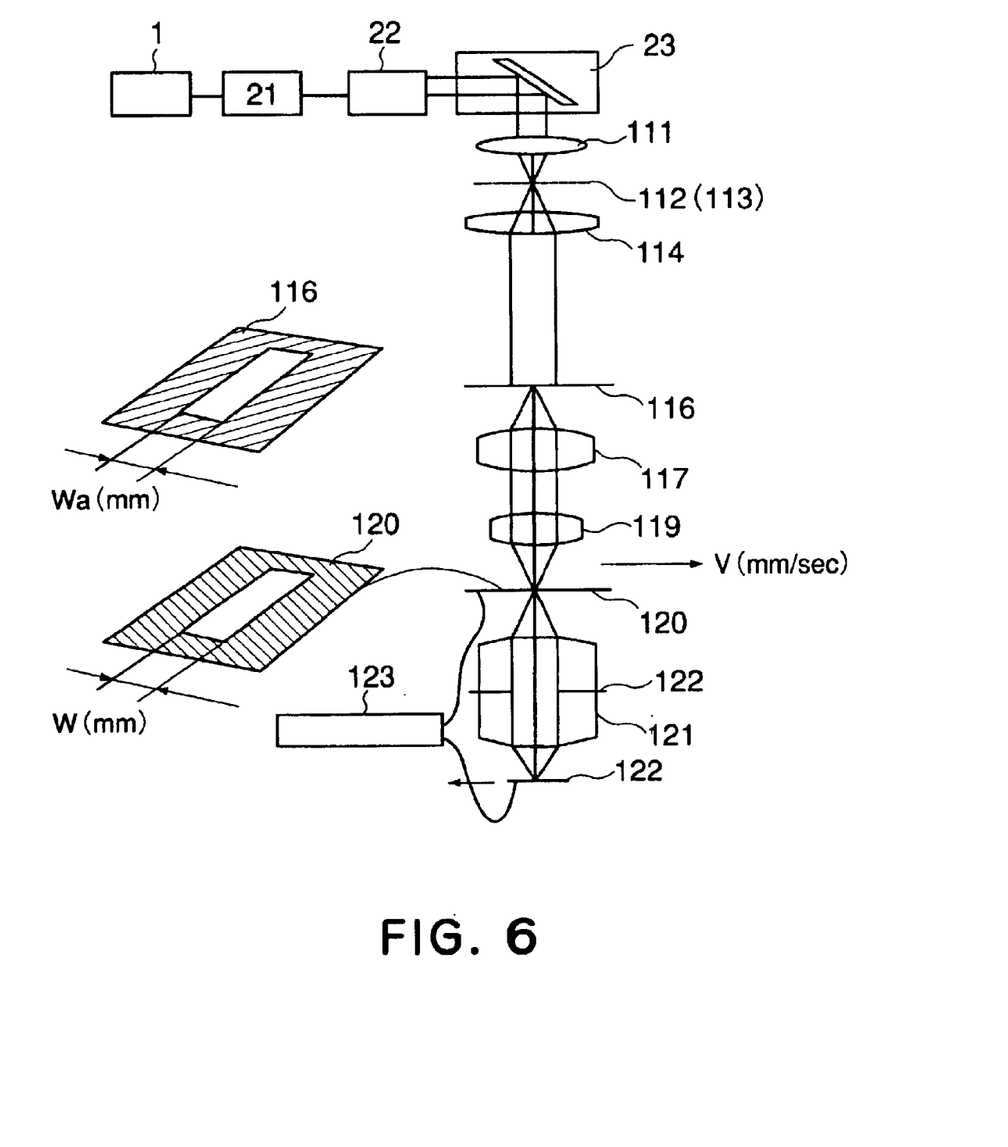
FIG. 6 is a schematic view for explaining a scanning system in an illumination optical system of a projection exposure apparatus according to the present invention, as well as an illumination region upon a reticle.

FIG. 6 illustrates the positional relationship between the scanning optical system 23 and the masking blade imaging system 25 (FIG. 3). In FIG. 6, light from the continuous emission excimer laser 1 goes through the polarization control system 21 and the sectional intensity distribution uniforming system 22, and thereafter it enters the scanning optical system 23. By means of the scanning optical system 23 and a lens system 111, a secondary light source (effective light source) 112 is produced on the plane 113. The scanning optical system scans the pupil plane of the illumination optical system with the light spot, so as to satisfy the equation (a) described above.

Then, through a lens system 114, the light from the secondary light source 112 is projected to Koehler-illuminate a masking blade 116, which includes plural movable blades (light blocking members). The masking blade 116 may have four movable blades in which edges of opposed blades may define a slit-like aperture having a width Wa (mm). The lens system 114 may include a fly's eye lens.

Denoted at 117 is a collimator lens for collecting the light passed through the masking blade 116. Denoted at 119 is a relay lens for collecting the light from the collimator lens 117 and for projecting the light onto a reticle (mask) 120, so that a slit-like illumination region of a width W (mm) is defined thereon. Denoted at 121 is a projection optical system for projecting, in a reduced scale, a pattern formed on the reticle 120 surface onto a wafer (semiconductor substrate) 122.

In this embodiment, the masking blade 116 and the reticle 120 are placed approximately in a conjugate relation with respect to an optical system including the collimator lens 117 and the relay lens 119. Further, the secondary light source plane 113 and the pupil plane 122 of the projection optical system 121 are held approximately in a conjugate relation.

Denoted at 123 is a movement control system which serves to move, in cooperation with a driving unit (not shown), the reticle 120 and the semiconductor substrate (wafer) 122 in directions of arrows, at the same ratio as the magnification of the projection optical system 121 and exactly at constant speeds.

With this procedure, the pattern formed on the reticle 120 is scanningly transferred to the wafer 122.

Figure 7:
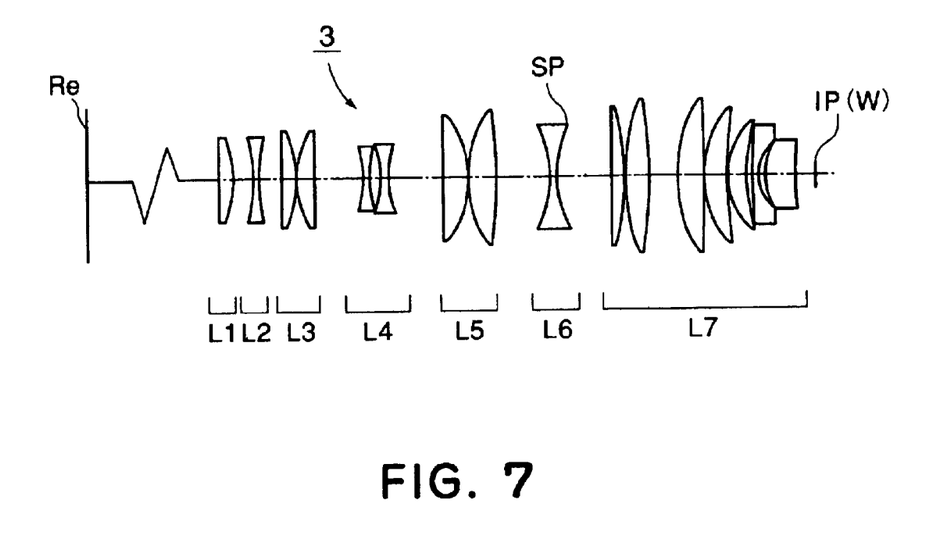
FIG. 7 is a sectional view of a main portion of a lens system of the projection optical system shown in FIG. 1.
Figure 8:
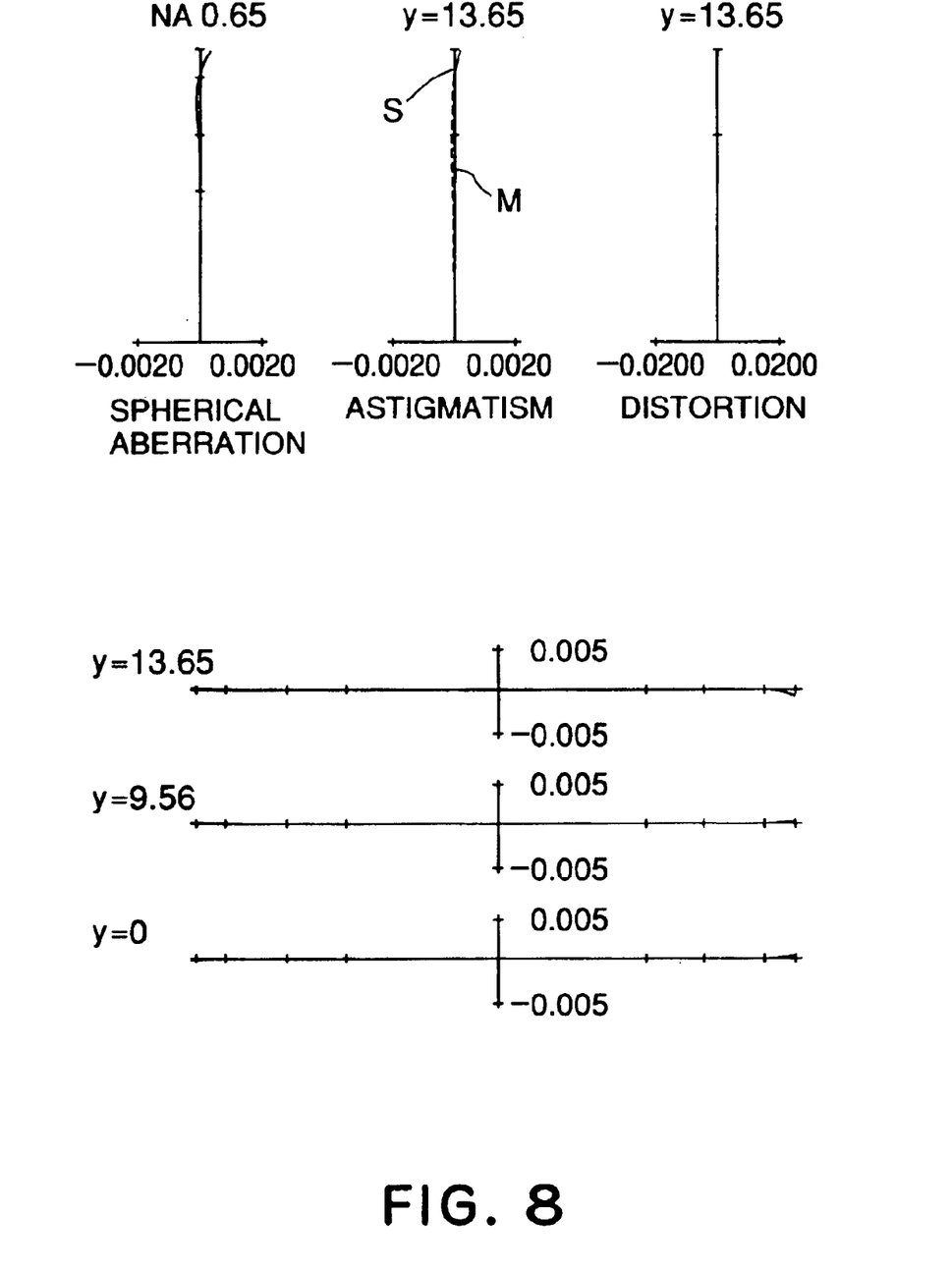
FIG. 8 illustrates aberrations of the lens system of the projection optical system shown in FIG. 1.

FIG. 7 is a sectional view of a main portion of the lens structure of a projection optical system 3 according to an embodiment of the present invention. FIG. 8 illustrates aberrations of the projection optical system of FIG. 7. In FIG. 8, Y denotes the image height on the wafer W surface, S denotes the sagittal image plane, M denotes the meridional image plane, and NA denotes the numerical aperture.

In the projection optical system of FIG. 7, all the lens elements thereof are made of synthetic quartz (SiO2). It has a projection magnification of ¼. The image side numerical aperture is NA=0.65, and the object-to-image distance (distance from reticle Re to wafer W) is L=1000 mm. The design wavelength is 193 nm and, as regards the field range, the diameter of the exposure region upon the wafer is 27.3 mm. Further, the projection optical system is substantially telecentric, both on the object side (reticle side) and the image plane side (wafer side).

Table 1 below shows the lens data of the projection optical system of FIG. 7.

TABLE 1

| i | ri | di | ni | Obj-distance = 64.400 |
|---|---|---|---|---|
| 1 | 0.000 | 21.483 | 1.56020 | |
| 2 | −234.177 | 32.837 | | |
| 3 | −217.725 | 11.000 | 1.56020 | |
| 4 | 417.996 | 33.850 | | |
| 5 | 0.000 | 22.468 | 1.56020 | |
| 6 | −167.357 | 0.700 | | |
| 7 | 146.365 | 26.864 | 1.56020 | |
| 8 | 2044.065 | 74.989 | | |
| 9 | −217.939 | 11.000 | 1.56020 | |
| 10 | 218.942 | 19.185 | | |
| 11 | −111.200 | 11.000 | 1.56020 | |
| 12 | 162.388 | 83.304 | | |
| 13 | 4095.070 | 42.510 | 1.56020 | |
| 14 | −165.000 | 0.700 | | |
| 15 | 203.723 | 45.798 | 1.56020 | |
| 16 | −760.044 | 82.340 | | |
| 17 | −183.459 | 11.000 | 1.56020 | |
| 18 | 188.694 | 20.934 | | |
| 19 | 0.0 (stop) | 68.080 | | |
| 20 | −2875.458 | 19.965 | 1.56020 | |
| 21 | −387.830 | 0.700 | | |
| 22 | 366.325 | 37.399 | 1.56020 | |
| 23 | −613.820 | 45.002 | | |
| 24 | 243.386 | 40.478 | 1.56020 | |
| 25 | −4311.737 | 0.700 | | |
| 26 | 181.915 | 35.797 | 1.56020 | |
| 27 | 981.126 | 0.700 | | |
| 28 | 119.183 | 27.705 | 1.56020 | |
| 29 | 256.810 | 9.045 | | |
| 30 | 770.652 | 11.000 | 1.56020 | |
| 31 | 80.000 | 10.112 | | |
| 32 | 122.097 | 47.000 | 1.56020 | |
| 33 | 275.295 | | | | aspherical surfaces

| i | K | A | B | C |
|---|---|---|---|---|
| 2 | 0.000000e + 000 | −1.11412e − 007 | 1.060175e − 011 | −7.279118e − 016 |
| 3 | 0.000000e + 000 | −7.330288e − 008 | 1.877977e − 011 | −1.654304e − 015 |
| 7 | 0.000000e + 000 | 1.794366e − 008 | −1.746620e − 012 | 2.819556e − 016 |
| 11 | 0.000000e + 000 | −1.072701e − 007 | −1.342596e − 012 | 7.030022e − 016 |
| 17 | 0.000000e + 000 | −1.232061e − 008 | 1.881593e − 012 | 2.948112e − 017 |
| 23 | 0.000000e + 000 | 5.143208e − 009 | 1.895658e − 013 | −2.954221e − 018 |
| 32 | 0.000000e + 000 | 2.598613e − 008 | 5.141410e − 012 | −1.743487e − 016 |

| i | D | E | F | G |
|---|---|---|---|---|
| 2 | 4.276504e − 020 | −7.962637e − 025 | 0.000000e + 000 | 0.000000e + 000 |
| 3 | 1.154005e − 019 | −3.636200e − 024 | 0.000000e + 000 | 0.000000e + 000 |
| 7 | −1.260857e − 020 | 4.866935e − 025 | 0.000000e + 000 | 0.000000e + 000 |
| 11 | 5.449568e − 020 | 5.143056e − 023 | 0.000000e + 000 | 0.000000e + 000 |
| 17 | −2.584618e − 021 | 1.229520e − 026 | 0.000000e + 000 | 0.000000e + 000 |
| 23 | −5.204719e − 023 | −5.427645e − 028 | 0.000000e + 000 | 0.000000e + 000 |
| 32 | −4.963194e − 020 | −1.947370e − 023 | 0.000000e + 000 | 0.000000e + 000 |

In Table 1, ri is the curvature radius of the i-th surface in an order from the object side (reticle side), di is the lens thickness of the i-th lens or the air spacing between the i-th and (i+1)th lenses, in an order from the object side, and ni is the refractive index of the glass of the i-th lens in an order from the object side.

Here, an aspherical shape is given by the following equation:

$$X = \frac{\frac{H^2}{r_i}}{1 + \left(1 - (1+k) \cdot \left(\frac{H}{n}\right)^2\right)^{\frac{1}{2}}} + A \cdot H^4 + B \cdot H^6 +$$

-continued
$$C \cdot H^8 + D \cdot H^{10} + E \cdot H^{12} + F \cdot H^{14} + G \cdot H^{16} + \ldots$$

wherein X is the amount of displacement from the lens vertex in the optical axis direction, H is the distance from the optical axis, ri is the curvature radius, k is the conical constant, and A–G are aspherical coefficients.

The refractive index of quartz with respect to the exposure wavelength of 193 nm is 1.5602. Also, the local curvature power PH of an aspherical surface is given by the following equation, while taking the aforementioned aspherical surface equation X as the function of X(H).

$$PH = \frac{N' - N}{\rho} \text{ where}$$

$$\rho = \frac{(1 + X'^2)^{\frac{3}{2}}}{X''}$$

wherein N and N' are the refractive indices of media before and after the refraction surface.

The projection optical system of FIG. 7 comprises, in an order from the reticle Re side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power. It uses seven aspherical surfaces.

The first lens group L1 comprises a single positive lens with an aspherical surface, and it has a flat-convex shape with its convex surface facing to the image side (wafer side). The aspherical surface at r2 includes a region in which the local curvature power changes in a positive direction. With this aspherical surface, mainly, a positive distortion aberration (distortion) is produced, which is contributable to correction of distortion.

The second lens group L2 comprises a single aspherical surface negative lens, having a biconcave shape (i.e., both lens surfaces have a concave shape). The aspherical surface at r3 includes a region in which the local curvature power changes in a negative direction. Also, with respect to the surface r2 of the lens group L1, it includes a region in which the local curvature power changes in an opposite direction.

The third lens group L3 comprises, in an order from the object side, a positive lens of a flat-convex shape and having a convex surface facing to the image side, as well as an aspherical positive lens of an approximately flat-convex shape and having a convex surface facing to the object side.

The fourth lens group L4 comprises, in an order from the object side, a negative lens of a biconcave shape, and a negative lens with an aspherical surface and having a biconcave shape. The aspherical surface at r11 includes a region in which the local curvature power changes in a negative direction. Also, with respect to the surface r2 of the lens group L1, it includes a region in which the local curvature power changes in an opposite direction. This aspherical surface is effective mainly to assure well-balanced correction of the image field aberration and coma, for example.

The fifth lens group L5 comprises, in an order from the object side, a positive lens of an approximately flat-convex shape and having a convex surface facing to the image side, as well as a positive lens of a biconvex shape (i.e., both lens surfaces having a convex shape).

The sixth lens group L6 comprises a single negative lens with an aspherical surface, and having a biconcave shape. With this aspherical surface, mainly, spherical aberration and coma to be produced by a strong negative refracting power can be corrected effectively.

The seventh lens group L7 comprises, in an order from the object side, (i) a positive lens of a meniscus shape and having a convex surface facing to the image side, (ii) a positive lens with an aspherical surface and having a biconvex shape, (iii) a positive lens of an approximately flat-convex shape and having a convex surface facing to the object side, (iv) two positive lenses of a meniscus shape and having a convex surface facing to the object side, (v) a negative lens of a meniscus shape and having a concave surface facing to the image side, and (vi) a positive lens of a meniscus shape and having a convex surface facing to the object side. In this seventh lens group L7, the aspherical surface where an axial light flux, which is a light flux emitted from the axis upon the object surface is used at a higher position, serves mainly to correct a negative spherical aberration to be produced by the seventh lens group that has a strong positive refracting power. Also, the aspherical surface used at the convex surface adjacent to the image plane is contributable mainly to assure well-balanced correction of the coma and distortion.

In accordance with the projection optical system of this embodiment, aspherical surface lenses are introduced at five surfaces, particularly, before the stop SP (reticle side). Mainly, this enables well-balanced and effective correction of the distortion, astigmatism and coma, for example. Further, a surface which is very influential to abaxial chief rays is formed by an aspherical surface, this being very effective mainly to correct aberrations related to abaxial rays and also being effective to reduce burdens for correction of other aberrations. This assures a good optical performance. Seven aspherical surface lenses are used in this embodiment, by which an optical system comprising sixteen lens elements in total is accomplished while satisfying a large numerical aperture NA, on the other hand.

The projection optical system shown in FIG. 7 comprises a monochromatic lens system in which all the lens elements are made of synthetic quartz ($SiO_2$). However, in the projection optical system of FIG. 7, one or two lens elements of the seventh lens group L7, which are closest to the wafer, or a cover glass member (not shown) used therein, may be made of fluorite ($CaF_2$). This improves the durability of the lens system. Thus, in the present invention, those referred to by the words "a lens system comprising a substantially single glass material" include lens systems in which a slightly different material or materials are used, such as described above.

As regards the glass material of the projection optical system according to the present invention, $CaF_2$ as well as $BaF_2$ and $MgF_2$, for example, are usable.

Figure 9:
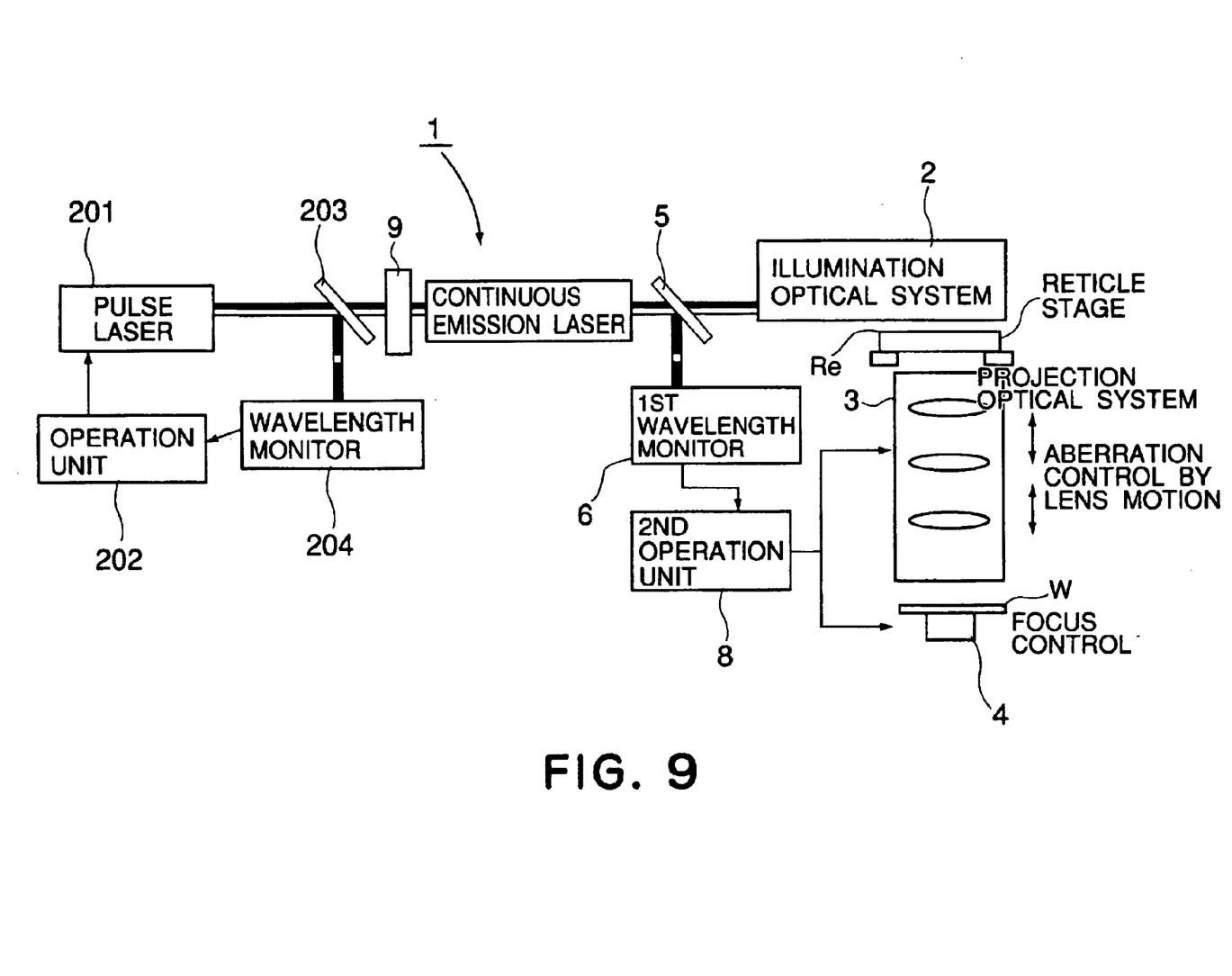
FIG. 9 is a schematic view of a main portion of a projection exposure apparatus according to a second embodiment of the present invention.

FIG. 9 is a schematic view of a main portion of a projection exposure apparatus according to a second embodiment of the present invention.

In FIG. 9, those elements corresponding to the components of the projection exposure apparatus of FIG. 1 are denoted by similar reference numerals and characters, and a description thereof is omitted. The projection exposure apparatus of FIG. 9 differs from that shown in FIG. 1, mainly in that it is provided with a mechanism for injecting pulse light, as produced by a pulse emission ArF excimer laser 201 having a center wavelength 193 nm and a half bandwidth not greater than 1 pm, into the continuous emission excimer laser 1, such that the emission wavelength of the continuous excimer laser 1 can be held at the emission wavelength of the pulse light. This procedure is called injection locking.

In continuous emission excimer lasers, in some cases, it takes a substantial time until, after a start of the emission, the emission wavelength becomes equal to a design value (usually, the same as the wavelength with respect to which an optical system is designed) or alternatively, in worst cases, the emission wavelength does not come to the design value. If, on the other hand, in accordance with the injection locking method, the pulse emission excimer laser light having an emission wavelength the same as the design wavelength thereof and having its bandwidth narrowed to 1 pm or less is injected into a continuous excimer laser, the emission wavelength of the continuous emission excimer laser can be held at the design wavelength of 193 nm thereof, just from a start of the emission.

A portion of the laser light outputted from the pulse emission excimer laser 201 is reflected by a semi-transmission mirror 203, and it enters a wavelength monitor 204. The wavelength monitor 204 serves to detect the wavelength of the pulse laser light, and it applies the detection result to an operation unit 202. On the basis of the output of the wavelength monitor 204, the operation unit 202 detects the amount of any deviation of the current center wavelength of the pulse laser light, from the design wavelength. Also, on the basis of the thus detected deviation, the operation unit 202 actuates a band-narrowing element inside the pulse emission excimer laser 201 (for example, it may be a prism, a diffraction grating or an etalon), so as to assure that the center wavelength of the pulse emission excimer laser 201 becomes equal to the design wavelength of 193 nm. As a result of this, the pulse laser light whose center wavelength is held at 193 nm can be injected into the continuous emission excimer laser 1. With this procedure, the emission wavelength of the continuous emission excimer laser 1 can be held at the design wavelength of 193 nm just from the start of emission.

After this, the pulse laser light is continuously injected into the continuous emission excimer laser 1 in accordance with the injection locking method, by which the center wavelength of the laser light outputted from the continuous emission excimer laser 1 can be adjusted and maintained substantially constant. Here, as will be described later, wavelength stabilization means may be applied to the continuous emission excimer laser 1 and, on that occasion, the injection locking may be discontinued once the pulse laser is injected.

If this adjustment is not complete, also in this embodiment, the second operation unit 8 operates on the basis of a signal from the wavemeter 6, to adjust a change in optical characteristic of the projection optical system caused by the failure of holding the wavelength from the excimer laser 1 at the design wavelength, in a similar manner as the embodiment of FIG. 1.

In accordance with this embodiment, in the projection optical system 3, which is a monochromatic lens system, any variation in the optical characteristics thereof such as magnification, focal point position or aberration, for example, due to changes in wavelength of the laser light from the continuous emission excimer laser 1, can be avoided. As a result, a circuit pattern of a reticle can be projected on a wafer W very accurately.

In accordance with this embodiment of the present invention, a projection exposure apparatus, by which a pattern image of a resolution not broader than 0.09 micron is attainable, is accomplished.

In this case, the excimer laser 1 may be a continuous emission $F_2$ excimer laser having a center wavelength of 157 nm, and a half bandwidth of 0.1 pm or less, preferably, and not greater than 0.08 pm.

Figure 10:
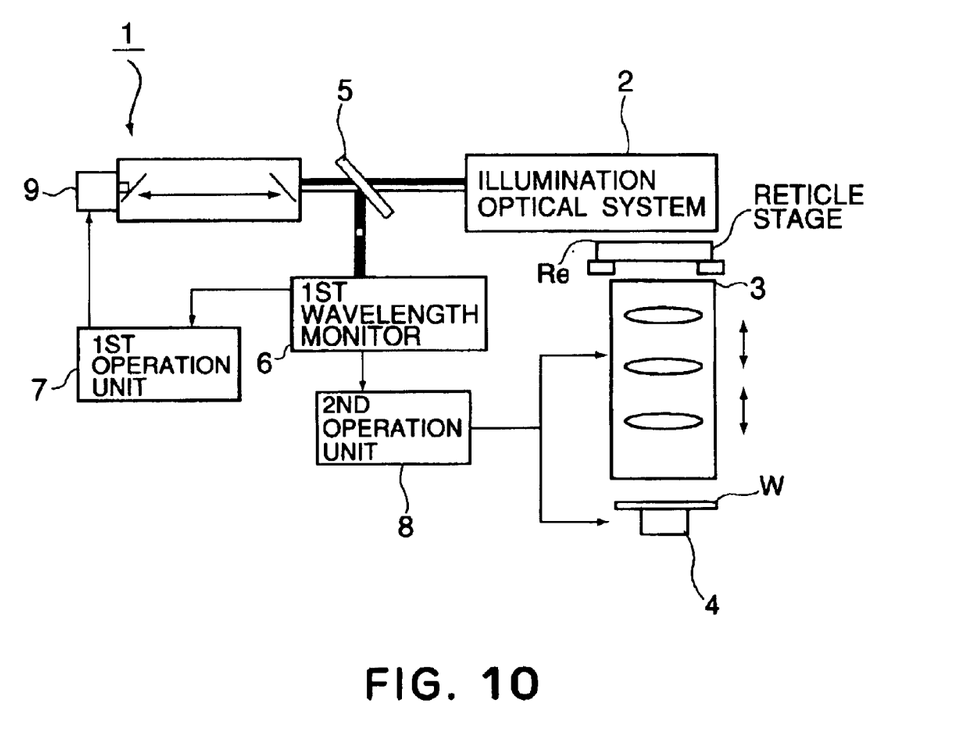
FIG. 10 is a schematic view of a main portion of a projection exposure apparatus according to a third embodiment of the present invention.

FIG. 10 is a schematic view of a main portion of a projection exposure apparatus according to a third embodiment of the present invention.

The projection exposure apparatus of FIG. 10 differs from that shown in FIG. 1 in that: although the second operation unit 8 operates on the basis of a signal from the wavemeter 6 to adjust a change in optical characteristic of the projection optical system caused by failure of holding the wavelength from the excimer laser 1 at the design wavelength, in a similar manner as in the embodiment of FIG. 1, if the adjustment is incomplete, the wavelength from the laser 1 is adjusted by means of the first operation unit 7.

The output of the wavemeter 6 is applied also to the first operation unit 7, such that, by means of a wavelength stabilization mechanism comprising the first operation unit 7 and the piezoelectric device 9, the wavelength from the continuous emission excimer laser 1 is adjusted.

The first operation unit 7 is operable in response to an output of the wavemeter 6, to detect any deviation of the current center wavelength (as represented by that output) from the design wavelength. Also, the first operation unit 7 is operable to actuate a piezoelectric device 9 on the basis of the detected deviation amount. The wavelength monitor 6, the first operation unit 7 and the piezoelectric device 9 are components of the wavelength stabilization mechanism for stabilizing the emission wavelength of the laser 1. By means of the first operation unit 7 and the piezoelectric device 9, a mirror for resonance of the laser 1 can be minutely oscillated in the optical axis direction to change the resonator length, by which the wavelength of the laser 1 can be adjusted. With this procedure and together with the second operation unit 8, in the projection optical system 3, which is a monochromatic lens system, any variation in optical characteristics such as magnification, focal point position and aberration, for example, due to changes in wavelength of the laser light can be avoided. Therefore, a circuit pattern of a reticle Re can be projected onto a wafer W very accurately.

The wavelength stabilization mechanism including wavemeter 6, operation unit 7 and piezoelectric device 9, for example, may be applied to the second embodiment shown in FIG. 6. On that occasion, the wavelength stabilization mechanism may be operated during injection of laser light. This enables that the center wavelength of the continuous emission excimer laser can be quickly held at the design wavelength. After this, the injection locking may be discontinued, unless the continuous emission excimer laser is restarted. This is because even if the injection locking is discontinued, as long as the wavelength stabilization mechanism is held in operation, the center wavelength of the laser light outputted from the continuous emission excimer laser can be maintained constant.

Further, as regards the method of changing the resonator length, in place of displacing a mirror, the pressure of a gas for excitation may be changed.

Further, the present invention is applicable also to a step-and-repeat type projection exposure apparatus for the manufacture of various devices such as semiconductor devices, liquid crystal devices, image pickup devices, or magnetic beads, for example.

Next, an embodiment of a device manufacturing method, which uses a projection exposure apparatus such as described above, will be explained.

Figure 11:
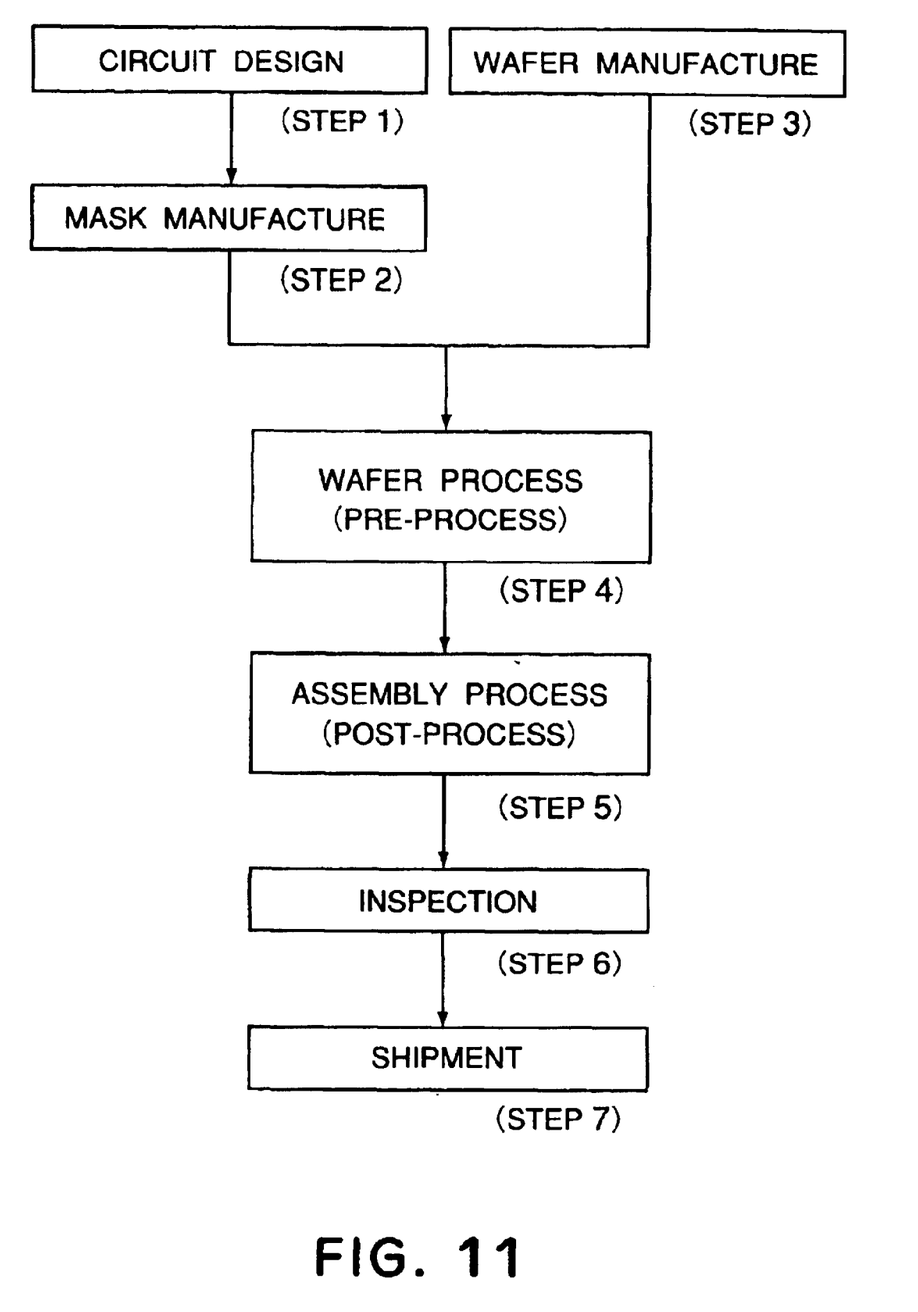
FIG. 11 is a flow chart for explaining device manufacturing processes according to an embodiment of the present invention.

FIG. 11 is a flow chart for explaining the procedure for manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process wherein, by using the thus prepared mask and wafer, a circuit is formed on the wafer in practice, in accordance with lithography. Step 5, subsequent to this, is an assembling step, which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 12:
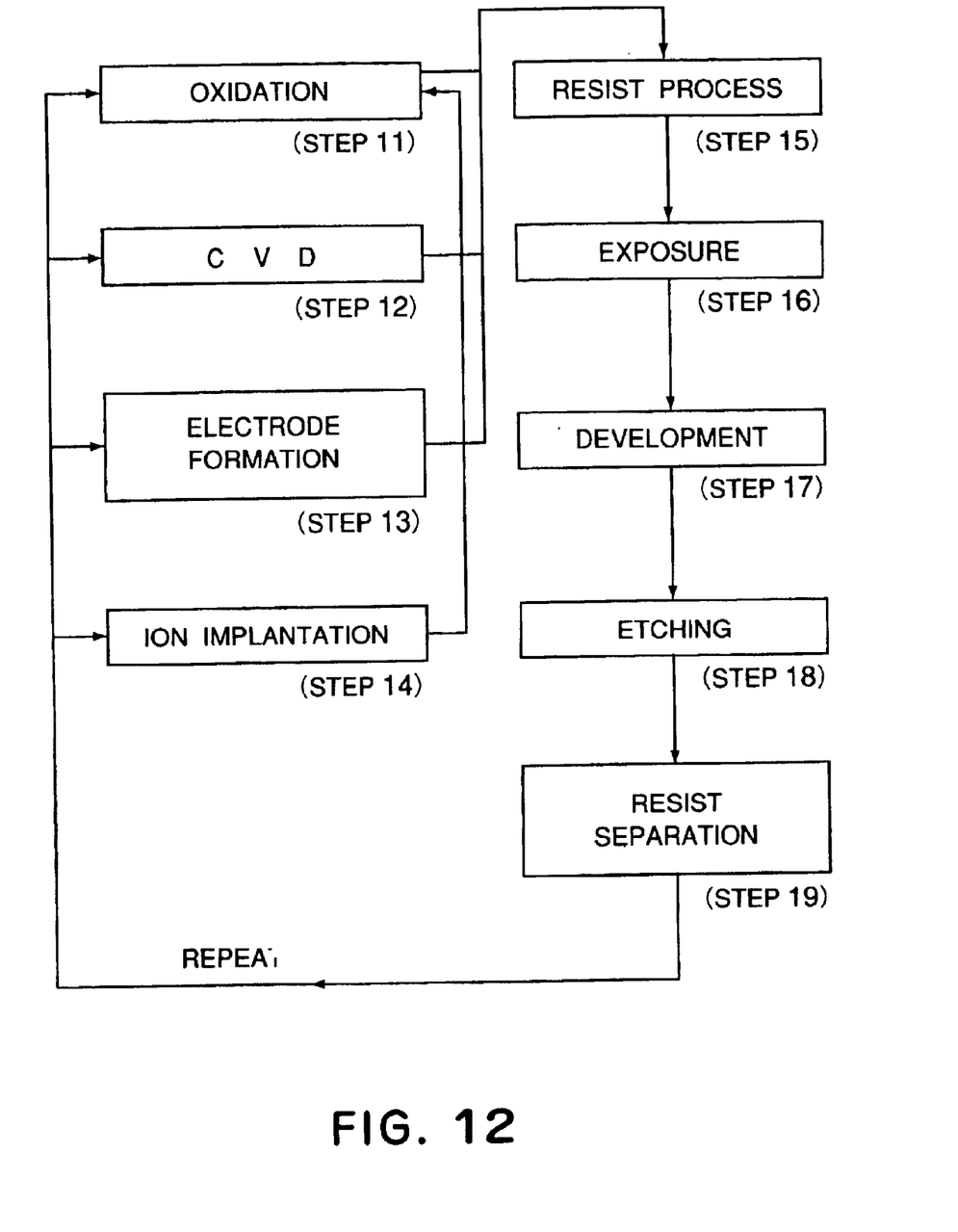
FIG. 12 is a flow chart for explaining details of a wafer process in the procedure shown in FIG. 10.

FIG. 12 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described above, a continuous emission excimer laser can be used as a light source, and also a monochromatic lens can be used as a projection exposure apparatus, yet a projection exposure apparatus and a device manufacturing method assure accurate projection of a reticle pattern on a substrate.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
    an illumination optical system for illuminating a pattern of a reticle with laser light from a continuous emission excimer laser;
    a projection optical system for projecting the illuminated pattern onto a substrate;
    adjusting means for adjusting an optical characteristic of said projection optical system in accordance with a change in wavelength of the laser; and
    wavelength stabilizing means for stabilizing the wavelength of the laser light when the adjustment of the optical characteristic of said projection optical system by said adjusting means is insufficient, said wavelength stabilizing means comprising a piezoelectric device, wherein the wavelength of the laser light is adjusted by driving the piezoelectric device,
    wherein (i) the half bandwidth of a wavelength spectrum of the laser light is not greater than 0.1 pm, (ii) the excimer laser is an ArF excimer laser, and (iii) the projection optical system consists of a refractive lens system constituted essentially by $SiO_2$.

2. An apparatus according to claim 1, wherein said adjusting means includes correcting means for correcting a change in optical characteristic of said projection optical system due to a change in wavelength of the laser light.

3. An apparatus according to claim 1, wherein said adjusting means includes detecting means for detecting the wavelength of the laser light.

4. An apparatus according to claim 1, wherein said adjusting means operates to adjust the optical characteristic of said projection optical system by (i) moving at least one of a reticle, a wafer and one or more lenses of said projection optical system in an optical axis direction of said projection optical system, (ii) tilting at least one of the reticle, the wafer and one or more lenses of said projection optical system, (iii) decentering one or more lenses of said projection optical system, or (iv) changing a pressure of a closed space between lenses.

5. An apparatus according to claim 1, further comprising driving means for scanningly moving the reticle and the substrate, wherein said illumination optical system illuminates the reticle with slit-like light of a rectangular or an arcuate shape.

6. A device manufacturing method, comprising the steps of:
    exposing a substrate with a pattern by use of a projection exposure apparatus as recited in claim 1; and
    developing the exposed substrate.

* * * * *

UNITED STATES PATENT AND TRADEMARK OFFICE
CERTIFICATE OF CORRECTION

PATENT NO. : 6,795,167 B2
DATED : September 21, 2004
INVENTOR(S) : Masakatsu Ota et al.

It is certified that error appears in the above-identified patent and that said Letters Patent is hereby corrected as shown below:

Column 4,
Line 3, "110" should read -- at 110 --.

Column 5,
Line 51, "value a" should read -- value σ --.
Line 54, "a a value" should read -- a σ value --.
Line 55, "small-94" should read -- small-σ --.

Column 7,
In "TABLE 1," in the first section, the sixth entry "6 -167.357 0.700" should read -- 6 -187.357 0.700 --; the seventeenth entry "17 -183459 11.000 1.56020" should read -- 17 -193.459 11.000 1.56020 --, and the eighteenth entry "18 188694 20.934" should read -- 18 188.694 20.034 --.
In "TABLE 1," in the third section, the last two entries in column "D,"
"23 -5.204719e - 023
 32 -4.963194e- 0.20" should read -- 23  5.204719e - 0.23
                                       32  4.963194e - 0.20 --.
In "TABLE 1," in the third section, the third entry in column "E," "4.866935e- 0.25" should read -- 4.866995e - 0.25 --.

Signed and Sealed this

Eighth Day of February, 2005

JON W. DUDAS
*Director of the United States Patent and Trademark Office*